US005237535A

United States Patent [19]

Mielke et al.

[11] Patent Number: 5,237,535

[45] Date of Patent: Aug. 17, 1993

[54] METHOD OF REPAIRING OVERERASED CELLS IN A FLASH MEMORY

[75] Inventors: Neal Mielke, Los Altos; Gregory E. Atwood, San Jose; Amit Merchant, Citrus Heights, all of Calif.

[73] Assignee: Intel Corporation, Santa Clara, Calif.

[21] Appl. No.: 773,228

[22] Filed: Oct. 9, 1991

[51] Int. Cl.[5] ........................ G11C 7/00; G11C 16/00

[52] U.S. Cl. .................................... 365/218; 365/185; 365/200; 365/900

[58] Field of Search ............... 365/218, 200, 900, 185, 365/207, 51; 371/21.1, 21.4; 357/23.5

[56] References Cited

U.S. PATENT DOCUMENTS

| | | | |
|---|---|---|---|
| 4,357,685 | 11/1982 | Daniele et al. | 365/185 |
| 4,742,491 | 5/1988 | Liang et al. | 365/218 |
| 4,797,856 | 1/1989 | Lee et al. | 365/185 |
| 4,841,482 | 6/1989 | Kreifels et al. | 365/900 |
| 4,860,261 | 8/1989 | Kreifels et al. | 365/900 |
| 5,060,195 | 10/1991 | Gill et al. | 365/900 |
| 5,065,364 | 11/1991 | Atwood et al. | 365/185 |
| 5,097,444 | 3/1992 | Fong | 365/218 |
| 5,122,985 | 6/1992 | Santin | 365/185 |
| 5,138,576 | 8/1992 | Madurawe | 365/218 |
| 5,139,935 | 7/1992 | Ashmore, Jr. | 365/185 |

FOREIGN PATENT DOCUMENTS

| | | | |
|---|---|---|---|
| 0452724 | 10/1991 | European Pat. Off. | 365/185 |
| 63-227064 | 9/1988 | Japan | 365/185 |
| 3225700 | 10/1991 | Japan | 365/218 |

*Primary Examiner*—Eugene R. LaRoche
*Assistant Examiner*—Andrew Tran
*Attorney, Agent, or Firm*—Blakely, Sokoloff, Taylor & Zafman

[57] ABSTRACT

A method of repairing overerased cells in a flash memory array including a column having a first cell and a second cell is described. Repair begins by determining whether a first cell is overerased and applying a programming pulse if so. Next, the second cell is examined to determine whether it is overerased. A programming pulse is applied to the second cell if it is overerased. Afterward, if either of the cells was overerased then the repair pulse voltage level is incremented. These steps are repeated until none of the cells on the column is identified as overerased.

38 Claims, 7 Drawing Sheets

FIG_1
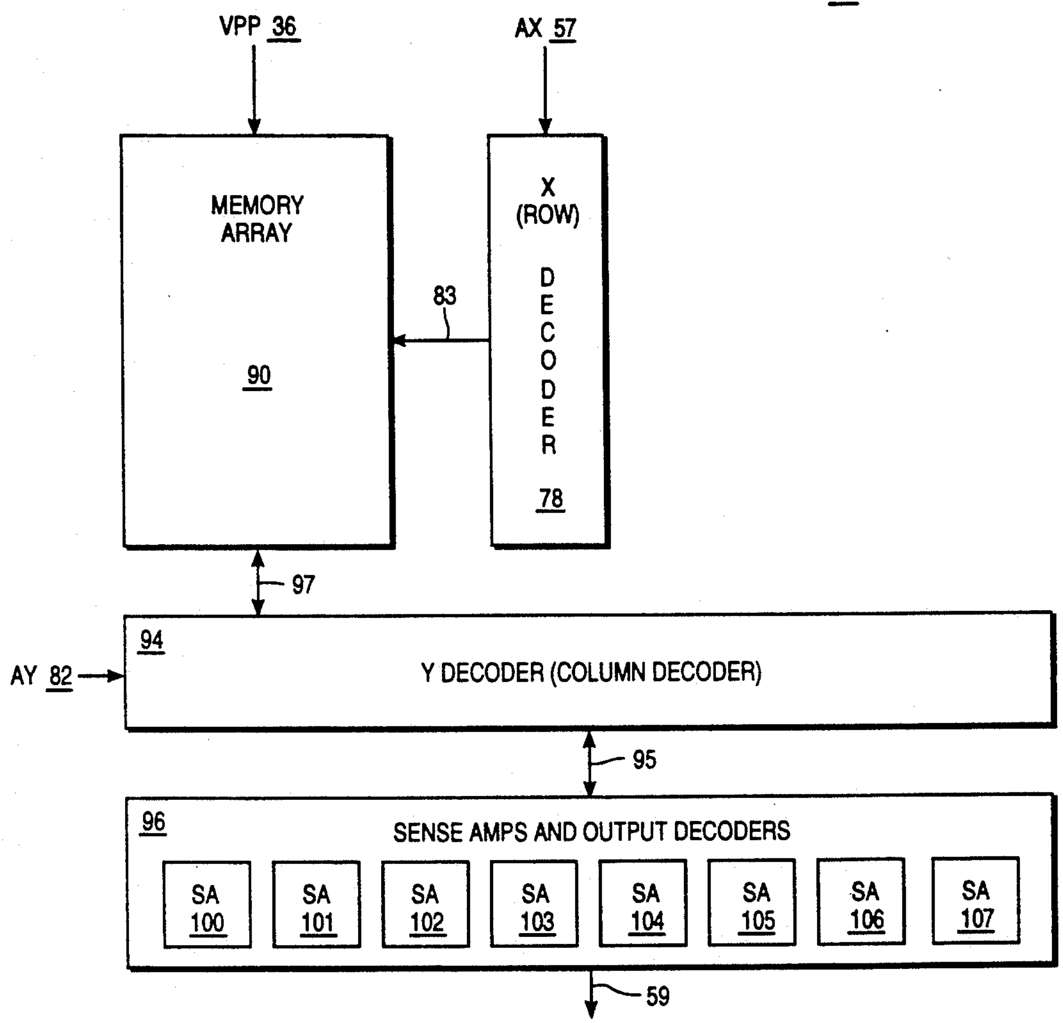
FIG_3
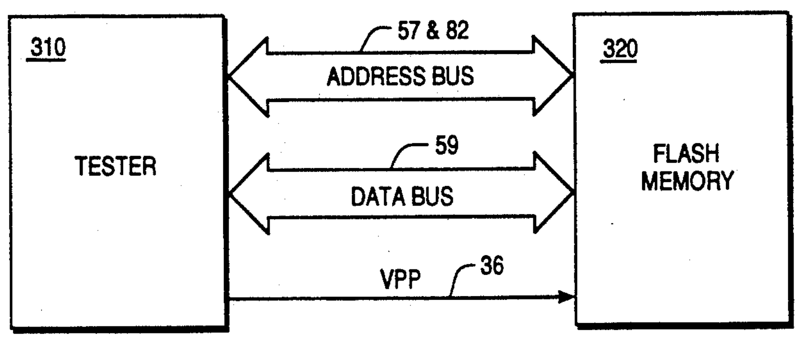

FIG_2
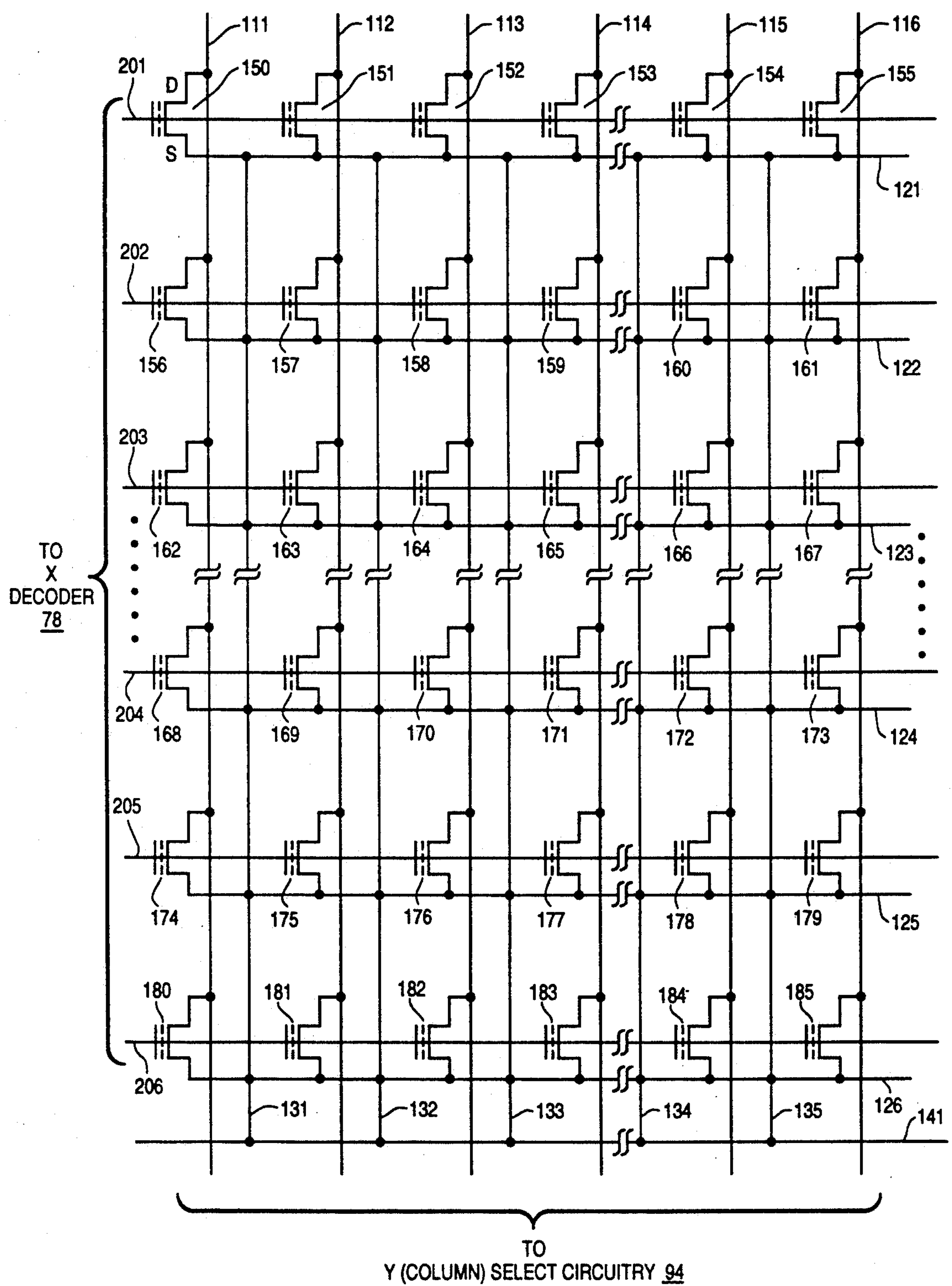

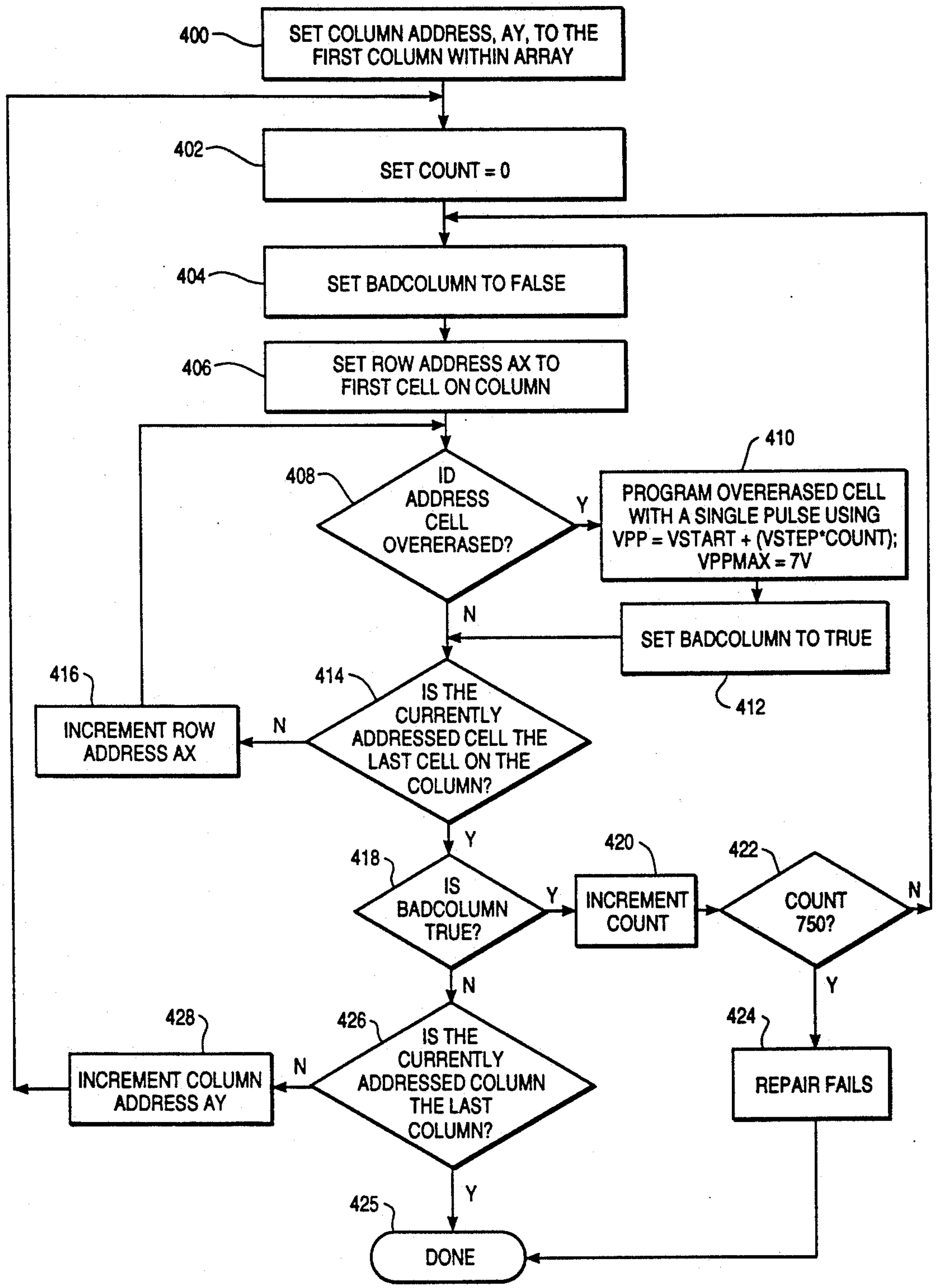
FIG_4
400
SET COLUMN ADDRESS, AY, TO THE FIRST COLUMN WITHIN ARRAY
402
SET COUNT = 0
404
SET BADCOLUMN TO FALSE
406
SET ROW ADDRESS AX TO FIRST CELL ON COLUMN
408
ID ADDRESS CELL OVERERASED?
Y
410
PROGRAM OVERERASED CELL WITH A SINGLE PULSE USING VPP = VSTART + (VSTEP*COUNT); VPPMAX = 7V
N
SET BADCOLUMN TO TRUE
412
416
INCREMENT ROW ADDRESS AX
N
414
IS THE CURRENTLY ADDRESSED CELL THE LAST CELL ON THE COLUMN?
Y
418
IS BADCOLUMN TRUE?
Y
420
INCREMENT COUNT
422
COUNT 750?
N
Y
N
424
REPAIR FAILS
428
INCREMENT COLUMN ADDRESS AY
N
426
IS THE CURRENTLY ADDRESSED COLUMN THE LAST COLUMN?
Y
425
DONE FIG_5
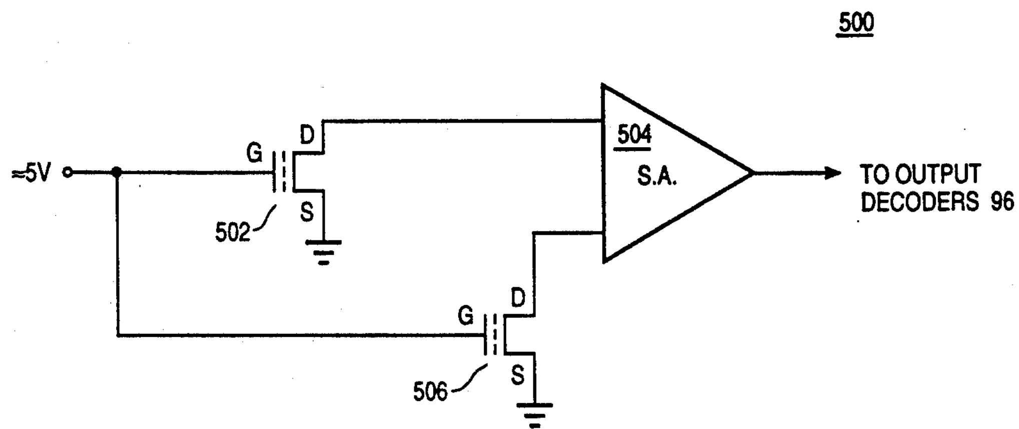
FIG_6
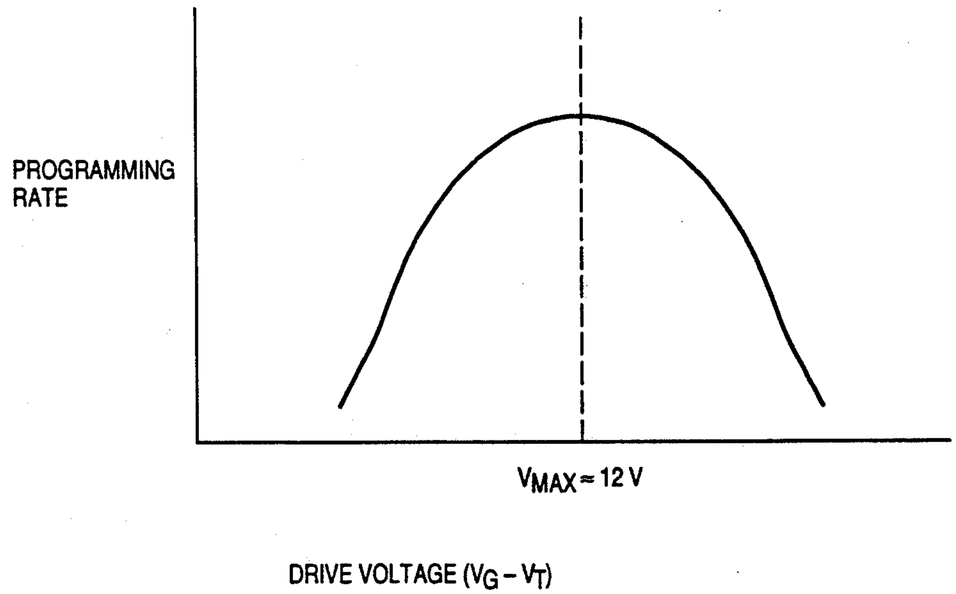

FIG_7
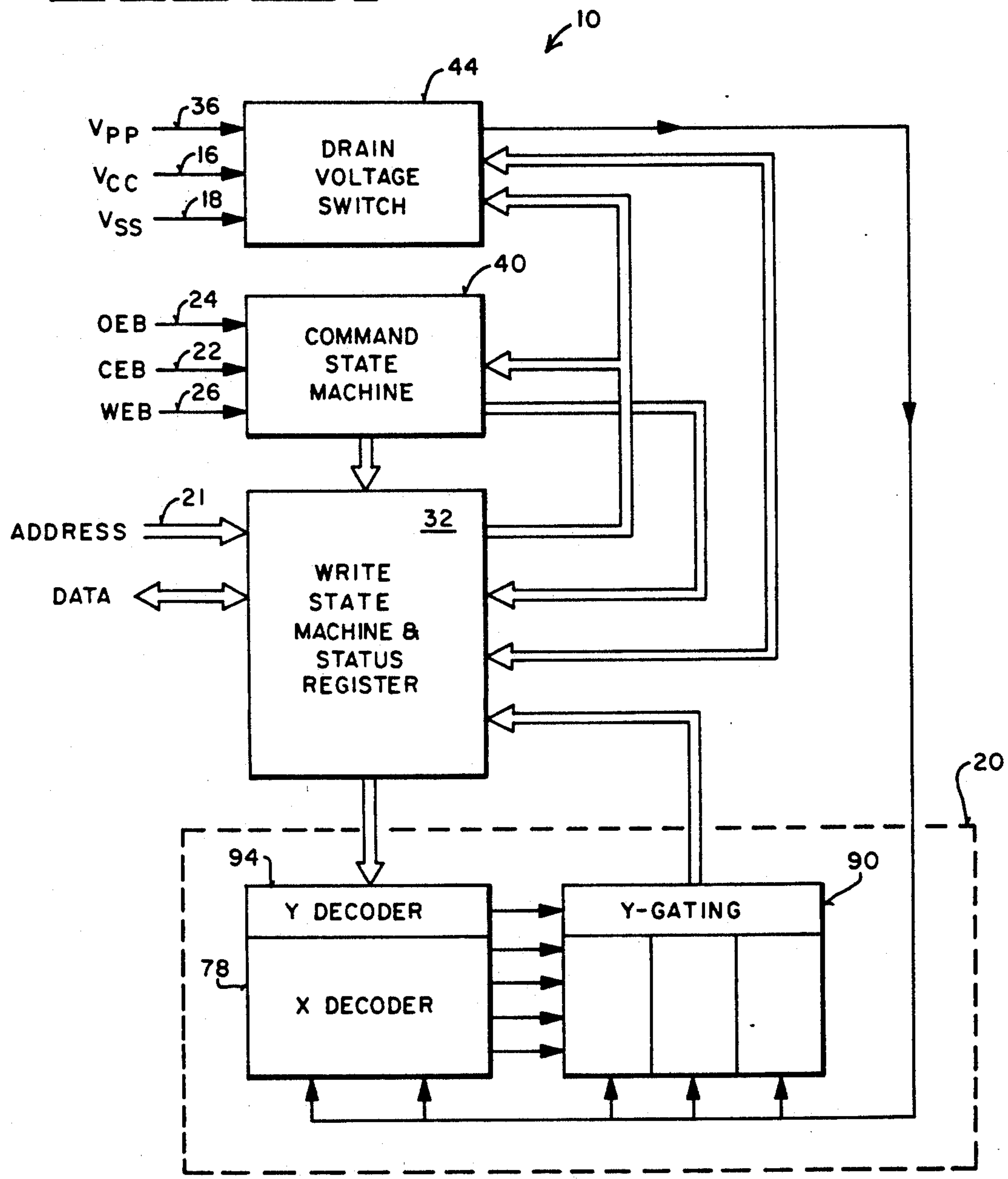

FIG. 8 WSM BLOCK DIAGRAM
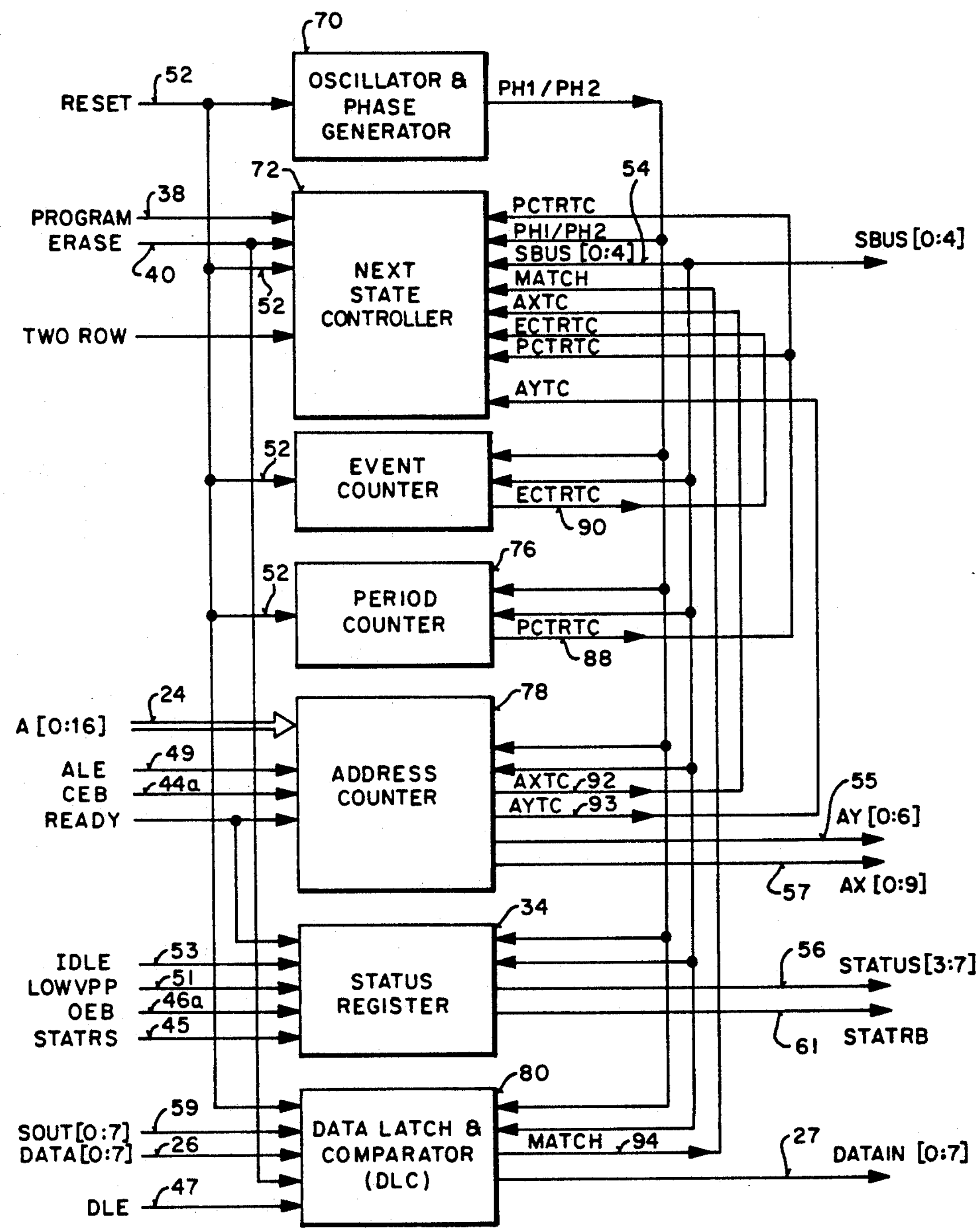

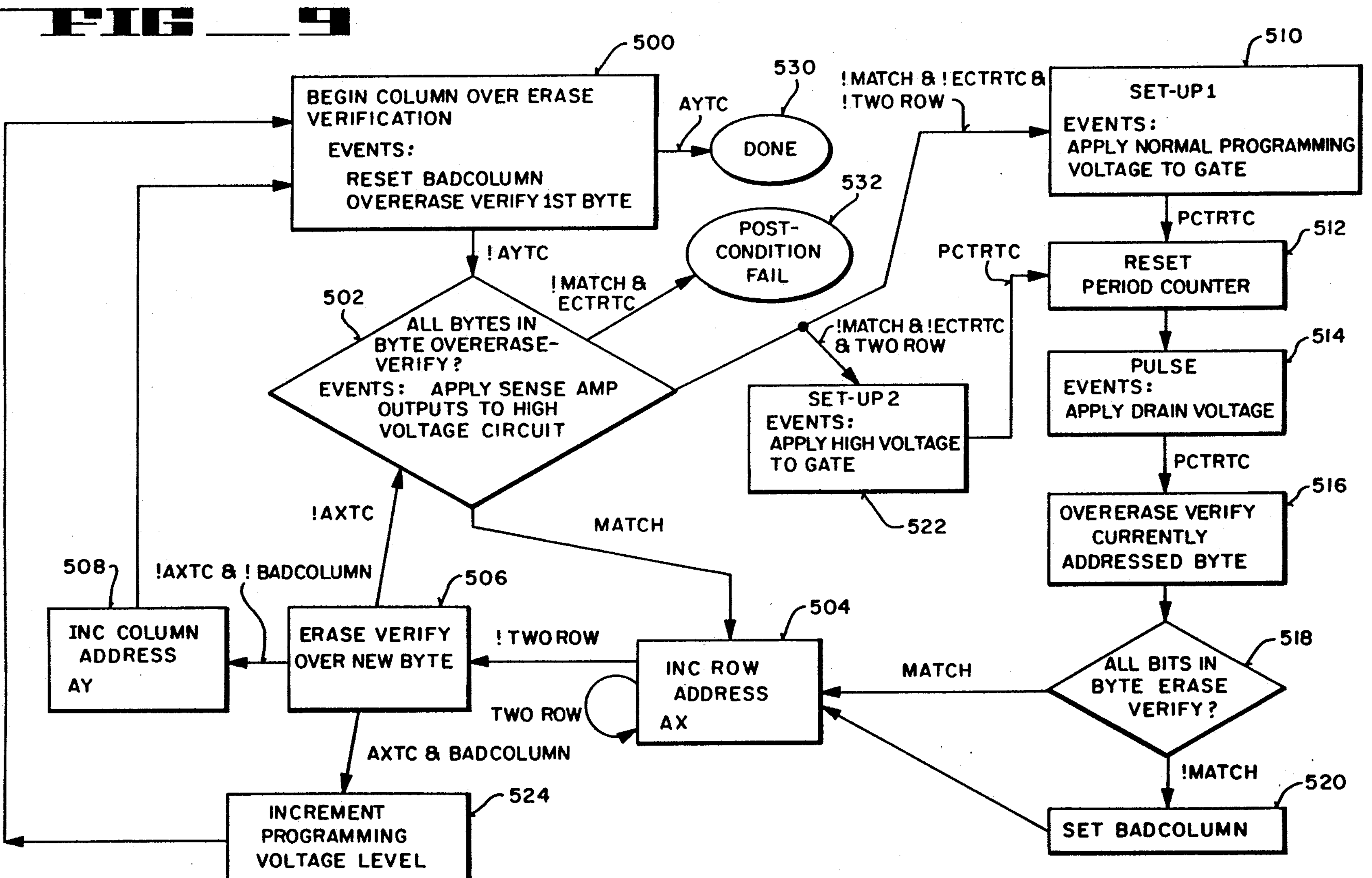
FIG 9
500
BEGIN COLUMN OVER ERASE VERIFICATION
EVENTS:
RESET BADCOLUMN
OVERERASE VERIFY 1ST BYTE
AYTC
530
DONE
532
POST-CONDITION FAIL
!AYTC
!MATCH & ECTRTC
502
ALL BYTES IN BYTE OVERERASE-VERIFY?
EVENTS: APPLY SENSE AMP OUTPUTS TO HIGH VOLTAGE CIRCUIT
!MATCH & !ECTRTC & !TWO ROW
510
SET-UP 1
EVENTS:
APPLY NORMAL PROGRAMMING VOLTAGE TO GATE
PCTRTC
512
RESET
PERIOD COUNTER
PCTRTC
!MATCH & !ECTRTC & TWO ROW
SET-UP 2
EVENTS:
APPLY HIGH VOLTAGE TO GATE
522
514
PULSE
EVENTS:
APPLY DRAIN VOLTAGE
PCTRTC
516
OVERERASE VERIFY CURRENTLY ADDRESSED BYTE
!AXTC
MATCH
508
!AXTC & !BADCOLUMN
506
INC COLUMN ADDRESS AY
ERASE VERIFY OVER NEW BYTE
!TWO ROW
504
INC ROW ADDRESS AX
TWO ROW
MATCH
518
ALL BITS IN BYTE ERASE VERIFY?
AXTC & BADCOLUMN
524
INCREMENT PROGRAMMING VOLTAGE LEVEL
!MATCH
520
SET BADCOLUMN

METHOD OF REPAIRING OVERERASED CELLS IN A FLASH MEMORY

FIELD OF THE INVENTION

The present invention pertains to a method of repairing overerased cells in flash memories. More particularly, the present invention pertains to a method of repairing overerased flash memory cells using channel-hot-electron programming.

BACKGROUND OF THE INVENTION

One type of prior nonvolatile semiconductor memory is the flash electrically erasable programmable read-only memory ("flash memory"). A flash memory can be programmed by a user, and once programmed, the flash memory retains its data until erased.

Flash memory cells are typically programmed using channel-hot-electron injection and erased by applying a high voltage to the cell's source junction. Erasure algorithms typically apply erases pulses to the entire array until the slowest erasing cell erases below the maximum threshold voltage acceptable. Cells erased below a minimum acceptable threshold are commonly referred to as being overerased. Overerased cells may induce a leakage current on their associated bit lines, thereby causing errors when reading other cells on the same bit line.

Manufactures of flash memories have attempted to minimize the incidence of cell overerasure using a variety of techniques. Integrated circuit process optimization and manufacturing quality control are typically employed. The complete elimination of overerasure using these methods is unlikely, however.

Sensitivity of a flash memory to overerasure can be minimized by optimizing read sensing schemes. Optimized read sensing schemes suffer from two disadvantages. First, they cannot eliminate overerasure. Second, they require trade-offs in terms of speed and performance.

Flash manufactures have also attempted to eliminate overerasure by testing memories and either by replacing defective cells with redundant elements or by simply discarding the memory.

Manufacturer testing has a number of disadvantages, however. First, fabrication of redundant elements adds cost, complexity, and read-speed delays to flash memories. Second, flash memories containing more defective cells than redundant elements must be discarded. Finally, manufacturer testing does not guarantee that cells that erase normally during test will not become defective after repeated program-erase cycles.

Error correction codes, such as Hamming-code schemes, are also employed to eliminate errors caused by overerasure. Unfortunately, the use of error correction codes typically requires adding extra memory cells to the flash memory, thereby increasing cost.

SUMMARY AND OBJECTS OF THE INVENTION

One object of the present invention is to repair overerasure in flash memories.

Another object of the present invention is to provide a method of repairing overerasure that is optimized for speed and power consumption.

A further object of the present invention is provide a method of repairing overerased cells that avoids discarding defective memories.

Another object of the present invention is to provide a method of repairing overerased cells that does not use redundant elements.

Yet another object of the method of the present invention is to repair overerasure in flash memories without increasing the area allocated to errorcode cells.

A method of repairing overerased cells in a flash memory array is described. A flash array includes at least one column having at least two cells. Repair of the array begins by determining whether the first cell is overerased, and applying a single programming pulse if so. Next, the second cell is examined to identify whether it is overerased. A programming pulse is applied to the second cell if it is overerased. Afterward, the repair voltage level is increased by a first amount if either of the cells was identified as overerased. These steps are repeated until neither cell is identified as overerased.

A still further object of the present invention is to provide a method of repairing overerased cells that is effective even after manufacturer testing has been completed.

Other objects, features, and advantages of the present invention will be apparent from the accompanying drawings and the detailed description that follows.

BRIEF DESCRIPTION OF THE FIGURES

The present invention is illustrated by way of example and not limitation in the figures of the accompanying drawings in which like references indicate similar elements and in which:

FIG. 1 is a block diagram of a flash memory;

FIG. 2 is a schematic of a portion of a memory array;

FIG. 3 is a block diagram of a circuit for overerasure repair;

FIG. 4 is state diagram of an algorithm for repairing overerasure;

FIG. 5 is a block diagram of an overerase verify circuit.

FIG. 6 is a graph of a flash memory cell's programming rate versus drive voltage;

FIG. 7 is a block diagram of a flash memory incorporating a write state machine;

FIG. 8 is a block diagram of a write state machine;

FIG. 9 is a state diagram for an algorithm for repairing overerasure using a write state machine.

DETAILED DESCRIPTION

A portion 20 of a flash memory is illustrated in FIG. 1. Portion 20 includes array 90, X decoder 78, Y decoder 94, and sense amplifiers and output decoders 96. Data is stored within array 90. Array 90 is accessed via X decoder 78 and Y decoder 94.

As described in more detail below, an iterative method is used to repair overerased cells of array 90. Cells on a column are first examined to determine whether they are overerased. Overerased cells receive a single low-voltage level programming pulse. Cells on the column are repeatedly examined and given a single programming pulse until none of the cells are identified as overerased and all cells are repaired.

Vpp 36 is the erase/program power supply for flash memory 20. In the absence of a high voltage level on Vpp, the flash memory acts as a read-only memory. The data stored at an address indicated by address lines 57 and 82 is made available via data lines 59.

Array 90 can be erased or programmed by raising Vpp 36 to 12 volts in conjunction with the proper command sequence.

The desired data within array 90 is selected using address signals AX 57 and AY 82. X decoder 78 selects the appropriate row within array 90 in response to AX 57. For this reason, X decoder 78 is also called row decoder 78. X decoder 78 activates the indicated row within array 90 via bus 83. Similarly, in response to AY 82 Y decoder 94 selects the appropriate column within array 90. Because of its function Y decoder 94 is also called column decoder 94. Y decoder 94 selects the indicated column using bus 97.

Data read from array 90 is output to Y decoder 94 via bus 97. Y decoder 94 passes the data from bus 97 to sense amplifiers 100-107. Sense amplifiers 100-107 determine whether or not a cell is negatively charged. Sense amplifiers 100-107 output data via bus 59.

A portion 200 of array 90 is shown in FIG. 2. Portion 200 includes memory cells 150-185, each of which is a field effect transistor. Cells 150-185 are formed at the intersections of word lines 201-206 and bit lines 111-116, as is the common practice.

Word lines 201-206 are also referred to as X lines, or row lines. Each of the word lines 201-206 is coupled to the gates of memory cells in a particular row. For example, word line 201 is coupled to the gates of memory cells 150-155.

Bit lines 111-116 are also referred to as column lines, or Y lines. Each of the bit lines 111-116 is coupled to a column of memory cells. For example, bit line 111 is coupled to the drains of memory cells 150, 156, 162, 168, 174 and 180. Bit lines 111-116 are also coupled to Y decoder 94.

Common source line 141 is coupled to a source switch that regulates the amount of voltage applied to the sources of memory cells 150-185. Common source line 141 is also coupled to first local source lines 121-126 and second local source lines 131-135. Each first local source line 121-126 is coupled to a particular row of array 90. Similarly, each second local source line 131-135 is coupled to a particular column. Together, source lines 121-126, 131-135, and 141 provide a path for applying voltages to the sources of cells 150-185.

As currently employed, memory cells 150-185 are programmed by applying a potential of approximately 12 volts to word lines 201-206, a potential of approximately 7 volts to bit lines 111-116, and tying common source line 141 to ground.

Memory cells 150-185 are erased by applying a potential of approximately 12 volts to common source line 141, grounding word lines 201-206, and allowing bit lines 111-116 to float. Properly erased memory cells have a positive threshold voltage somewhere between 0 volts and 3 volts.

Erasure of array 90 is accomplished using an algorithm controlled by on-chip logic or by an off-chip microprocessor. These algorithms typically repeatedly apply erase pulses to array 90 until the slowest erasing cell in array 90 erases below the maximum threshold voltage acceptable.

Array 90 may contain a number of defective memory cells that erase much faster than the other memory cells. These defective memory cells can be erased to threshold voltages below the minimum acceptable erase voltage, typically zero volts, in the same time necessary to bring the threshold voltage of the slowest erasing cells down to an acceptable level, i.e. down to approximately 3 volts. These defective memory cells may then induce a leakage current on their associated bit lines 111-116, even with their gates grounded. As a result, during overerase verification of properly erased cells the current sensed by sense amplifiers 100-107 will be the sum of the properly erased cell's current and the bit line leakage current. Because of this properly erased cells may be misidentified as overerased. In other words, as a result of bit-line leakage current the threshold voltage of properly erased cells will be identified as being below zero volts.

Misidentification of properly erased cells poses the danger that the cell will be over-repaired by raising its threshold voltage in an attempt to make the cell pass erase-verification. Over-repair occurs when a cell's threshold voltage is raised above the upper acceptable limit for erasure.

FIG. 3 illustrates one circuit 300 for repairing overerased flash memories. Circuit 300 includes tester 310 and a flash memory 320 to be repaired, which includes a portion 20. Tester 310 is preferably computer controlled. Less sophisticated equipment may also be used, however. The function of tester 310 may also be realized using a write state machine, as discussed below.

Tester 310 generates all the inputs required by flash memory 320 and reads the data output by memory 320. Address signals from tester 310 are applied to buses 57 and 82. Tester 310 also generates and controls program/erase voltage, Vpp 36. Tester 310 varies the voltage level of Vpp 36 as required to repair overerased cells. On bus 59 tester 310 reads data output by flash memory 320. Tester 310 repairs overerased cells utilizing the algorithm of FIG. 4.

Briefly stated, the method of repairing overerased cells is an iterative process utilizing overerase verification and low voltage level programming. Repair begins by selecting a column and examining each cell on that column to determine whether any cells are overerased. This procedure is commonly referred to as overerase verification. A cell is identified as overerased when it conducts current in excess of the current expected at the lowest acceptable threshold voltage. Repair proceeds by applying a single, low-level programming pulse to the overerased cell. Stated another way, repair begins with the application of a repair pulse to an overerased cell. The level of the repair pulse is low enough to ensure that the cell will not be over-repaired, regardless of the other operating conditions. The remaining cells on the column are examined in the same fashion. If any cell on the selected column was identified as overerased, each cell on the column is overerase verified a second time. Cells identified as overerased will again be programmed with a single low-level pulse. The voltage level of the programming pulse for the current repair pass is increased, however, as compared to the previous repair pass. These steps are repeated until none of the cells on the column are identified as overerased.

The present repair method can tolerate a maximum bit line leakage current of hundreds of microamps. This robustness arises in part from the proper choice of the initial repair voltage level and the difference in behavior between defective cells and normal cells. Suppose that a column includes a severely overerased cell with a threshold voltage $V_T$ of approximately −5 volts. The severely overerased cell will draw sufficient current to cause all other cells on the same column to fail the overerase verify test. According to the present repair method, each cell on the column is programmed once at a very low voltage level. The voltage of the initial repair pulse is chosen to be low enough to guarantee that none of the cells on the column will be over-repaired. In general, channel-hot-electron programming depends exponentially on the drive voltage ($V_G-V_T$), where $V_G$ is the gate voltage used during programming and $V_T$ is the threshold voltage of the cell being programmed. With $V_G$ equal to 5 volts, a properly-erased cell with a $V_T$ of 2 volts will program very slowly. In contrast, the severely overerased cell will program very quickly. Thus, the initial, low level programming pulse will have little effect on properly erased cells but will greatly effect the severely overerased cell. As a consequence of the initial programming/repair pass, the bit line leakage current during the next programming/repair pass is reduced. The multiple pass repair method helps eliminate errors caused by leakage current and helps reduce the risk of over-repair.

Beginning repair at a low gate voltage level is advantageous for another reason. No one specific voltage is optimum for repairing every flash memory, or even for the same flash memory across its usable lifetime, because channel-hot-electron programming characteristics vary with temperature, manufacturing condition, and amount of use. Thus, by starting at a low voltage level, the present overerase repair method accommodates a wide spectrum of specific optimum voltages.

The present repair method offers other advantages. Using the present method defective memories can be repaired rather than discarded. The present repair method does not require the use of valuable redundant elements because defective cells are repaired rather than by-passed. Additionally, the present repair method allows repair of overerased cells subsequent to manufacturer testing.

FIG. 4 illustrates the present repair method in detail. Repair begins in step 400 with tester 310 setting address signal $A_Y$ 82 to the first column within array 90. The first column within array 90 is chosen solely for convenience.

After setting address signal $A_Y$82, tester 310 proceeds to step 402. In step 402 a counter, called COUNT, is initialized to zero. Tester 310 will use COUNT to keep track of the number of programming/repair passes that have been made of the currently addressed column.

From step 402 tester 310 branches to step 404. During step 404 tester 310 sets a flag, BADCOLUMN, to false. BADCOLUMN indicates whether any of the cells on the currently addressed column have been identified as overerased. Based upon BADCOLUMN, tester 310 later decides whether another programming/repair pass of the currently addressed column should be made.

Tester 310 branches to state 406 from state 404. In state 406 tester 310 sets address signal $A_X$ 57 to the first cell on the selected column. Again, the first cell is chosen solely for the convenience.

From state 406 tester 310 branches to state 408. In state 408 tester 310 examines the threshold voltage of the currently addressed cell to determine whether that cell is overerased. A cell is considered overerased if its threshold voltage is below zero volts.

Tester 310 determines whether a cell is overerased using the OVERERASE-VERIFY command in conjunction with a special reference cell. The OVERERASE-VERIFY command allows flash memory users to determine whether an erase operation has been successful. A trimmable reference cell allows tester 310 to determine whether a cell is overerased using the OVERERASE-VERIFY command.

An overerase verify circuit 500 set-up using the OVERERASE-VERIFY command is illustrated in FIG. 5. Array cell 502 is selected by address signals $A_Y$ 82 and $A_X$ 57. Cell 502 is coupled to one input of sense amplifier 504. The other input of sense amplifier 504 is tied to trimmable reference cell 506. Prior to beginning overerase verification, usually during manufacture, the threshold voltage of reference cell 506 is trimmed to a voltage representing the lowest acceptable voltage for erased cells. Preferably, the threshold voltage of reference cell 506 is trimmed to 0.5 volts.

During overerase verification the same voltage level, approximately 5 volts, is applied to the gates of both array cell 502 and reference cell 506. If cell 502 has a threshold voltage below that of reference cell 506 then sense amplifier 504 will output a logic one, indicating to tester 310 that cell 502 is overerased. Analogously, a logic zero from sense amplifier 504 indicates to tester 310 that cell 502 is not overerased.

Alternatively, overerase verification can be performed using ERASE-VERIFY and PROGRAM-VERIFY commands. All verify commands couple a special reference cell to each sense amplifier; the sole difference between these commands is the $V_T$ of the special reference cell. As long as the special reference cell associated with a particular command is trimmed to a $V_T$ of approximately 0.5 V overerase verification can be performed using that particular command.

The overerase verify scheme of FIG. 5 will correctly identify all overerased cells. Bit line leakage current can, however, cause circuit 500 to misidentify a properly erased cell as overerased. The danger of misidentification is that the misidentified cell will be over-repaire. The initial programming voltage level is therefore chosen to prevent over-repair.

If a cell is identified as overerased in step 408, tester 310 will branch to step 410. Tester 310 attempts to repair the overerased cell in step 410 by applying a single programming pulse. The first pass down the addressed column, tester 310 raises Vpp 36 to an initial voltage level, $V_{START}$, and issues a PROGRAM command.

$V_{START}$ should be low enough so that a single pulse applied to a cell gate cannot cause over-repair, regardless of operating conditions. $V_{START}$ should also be high enough to ensure that the voltage at the cell drain is high enough to permit programming. The minimum acceptable voltage at the cell drain during programming is approximately 4 volts, thus without independent control of gain and drain voltages, and given that drain voltages are typically Vpp/2, the lowest possible $V_{START}$ is approximately 8 volts. In circuits permitting independent control of gate and drain voltages, repair can take place with gate voltages as low as 3 volts. Channel-hot-electron programming is preferred with a $V_{START}$ of 5 volts.

After applying a single programming pulse to the overerased cell, tester 310 branches to state 412. In state 412, tester 310 sets BADCOLUMN to true, indicating that at least one cell on the currently addressed column was identified as overerased.

Tester 310 branches to state 414 from state 412. In state 414, tester 310 determines whether it has overerase verified each cell on the currently addressed column. Tester 310 makes this determination based upon row address signal $A_X$ 57.

If not every cell has been examined, tester 310 branches to state 416. Row address $A_X$ 57 is incremented in state 416, preparing tester 310 to examine the next cell on the column.

From state 416, tester 310 branches back to state 408 to overerase verify the currently addressed cell. If the cell is overerased, tester 310 branches through steps 410, 412, 416 and 414, as previously described. On the other hand, if the currently addressed cell is not overerased tester 310 branches directly to state 414 from state 408.

Tester 310 branches to state 418 from state 414 when every cell on the currently addressed column has been overerase verified. In state 418, tester 310 examines BADCOLUMN. If any cell was identified as overerased during the last programming repair pass tester 310 branches to state 420 to begin another programming/repair pass.

Tester 310 increments counter COUNT by one in state 420. From state 420, tester 310 branches directly to state 422.

In state 422 tester 310 determines whether the maximum number of programming/repair passes for the currently addresses column has been exceeded. The maximum number of programming repair passes is set to 750 per column. In an alternative embodiment, the maximum number may be set to any arbitrary number. The maximum number of programming/repair passes per column may also be modified to compensate for programming pulses of differing durations.

Tester 310 branches to state 424 from state 422 when the maximum number of programming/repair passes has been completed. In state 424 tester 310 indicates that the repair scheme has failed. From state 424 tester 310 branches to state 425 and repair ends.

On the other hand, if the maximum number of programming/repair passes have not been performed, tester 310 branches to state 404 from state 422. In state 404, tester 310 resets BADCOLUMN to false in preparation for the next programming/repair pass.

Tester 310 next branches to state 406 from state 404. There cell address $A_X$ 57 is reinitialized to the first cell on the currently addressed column.

From state 406 tester 310 branches to state 408. In this state tester 310 reexamines the first cell to determine whether it is overerased. If the currently addressed cell is overerased, tester 310 branches to state 410.

Tester 310 applies a single programming pulse to the overerased cell in step 410. In programming/repair passes subsequent to the first pass Vpp 36 is stepped up from $V_{START}$. The preferred step size, $V_{STEP}$, is 0.5 volts. In alternative embodiments, other step sizes may be used.

Vpp is set according to equation 1.

$$V_{pp} = V_{START} + \text{COUNT} \cdot V_{STEP} \text{ if } V_{pp} \leqq 7 \text{ volts}; \quad V_{pp} = 7 \text{ volts} \quad \text{otherwise.} \qquad (1)$$

The maximum prgramming voltage level is 7 volts.

A maximum gate voltage of 7 volts is preferred to avoid over repairing properly erased cells. The choice of 7 volts arises from the programming rate characteristic of a flash memory cell, which is illustrated in FIG. 6. The programming rate of a flash memory cell increases as drive voltage, $V_G - V_T$, increases up until reaching $V_{max}$, a maximum drive voltage, which is approximately 12 volts. After $V_{max}$, the programming rate decreases as drive voltage increases. Because each cell on a column may possess a different $V_T$, the programming characteristic of FIG. 6 poses a hazard to the robustness of the present overerase method. Consider the repair of a column including a severaly overerased cell with a $V_T$of −5 V and several properly erased cells with $V_T$s of 1 V. Using a $V_G$ of 8 to repair the column means that the drive voltage of the severely overerase cell exceeds $V_{max}$ while the drive voltages of the properly erased cells are less than $V_{max}$. As a result, the programming rate of the severely erased cell is decreasing while programming rate of the properly erased cells is increasing. It is therefore possible for increases in $V_G$ to over-repair the properly erased cells. The present method avoids over-repair by limiting $V_G$ to a maximum 7 volts. In alternative embodiments, a $V_G$excess of 7 volts may be used. Such repair methods are merely less robust than the preferred method in terms of preventing over-repair.

After applying a programming pulse to the overerased cell, tester 310 branches to state 412. In state 412, tester 310 sets BADCOLUMN to true, indicating at least one cell on the currently addressed column is overerased.

Tester 310 branches to state 414 from state 412. If not every cell on the currently addressed column has been overerase verified during the current pass then tester 310 branches through states 416, 408, 410, and 412 as previously discussed. Once every cell on the currently addressed column has been overerased verified then tester 310 branches through states 418, 420, 422, 404, and 406 as previously described.

If the repair scheme is successful then there will be a programming/repair pass of a column during which no cell will be identified as overerased. In other words, there is some pass in which tester 310 reaches state 418 and BADCOLUMN is false. When BADCOLUMN is false, all cells on the currently addressed column have been repaired and tester 310 branches to state 426.

In state 426 tester 310 determines whether every column within array 90 has been reparied. If every column has not been repaired, tester 310 branches to state 428.

Tester 310 increments the column address $A_Y$ 82 in preparation of repairing the next column within array 90. From state 428 tester 310 branches up to state 402 and cycles through states 402, 404, 406, 408, 410, 412, 414, 416, 418, 420, and 422 as previously described.

Once every column within array 90 has been repaired, tester 310 ends repair by branching to state 425 from state 426.

Repair of overerased cells can be accomplished using alternative algorithms. The method of FIG. 4 repairs cells by incrementing programming voltage levels while programming pulse duration remains constant. In an alternative embodiment, it is also possible in step 410 to use a constant programming voltage level and increment the programming pulse duration.

Step 410 may also be modified to allow the application of multiple programming pulses, as opposed to a single pulse, to overerased cells. In fact, programming pulses may be applied repeatedly until the overerased cell is repaired. Such alternatives are simpler than the preferred embodiment, through less robust.

Alternatively, all cells within an array may be repaired, rather than repairing only overerased cells. In other words, step 408 may be eliminated. This alternative is less robust than the preferred embodiment in that cells are more likely to be over-repaired.

Alternative methods of performing the overerase verification of step 408 may also be used. For example, rather than applying the same voltage to the gates of both the reference cell and the array cell, different voltage levels may be used so that the reference cell's threshold voltage does not have to be trimmed to the lower acceptable limit for erased cells. Also, any other source of current, such as a transistor or a resistor, may be substituted for the reference cell 506.

In yet another embodiment, defective columns or defective bytes may be identified, rather than overerased cells. All cells within the defective byte or column are programmed until the entire byte or column is overerase verified.

FIG. 7 shows in block diagram form another circuit for repairing overerased flash memory cells that incorporates write state machine (WSM) 32. Write state machine 32 controls the programming, erasure, and overerase repair of flash memory array 20.

Write state machine 32 performs its functions in conjunction with other circuitry also fabricated on the same substrate as array 20. Drain voltage switch 44 distributes DC voltages to drains throughout flash memory 20. Command state machine 40 decodes control signals OEB 24, CEB 22 and WEB 26 and instructs write state machine 32 to perform the selected operation.

DC inputs to flash memory 20 include Vpp 36, the erase/program power supply voltage. Vcc 16 is the device power supply and Vss 18 is ground. In one embodiment, Vpp 36 is 12.0 and Vcc 16 is approximately 5 volts.

In the absence of high voltage on Vpp 36, flash memory 20 acts as a read-only memory. The data stored at the addressed location is read from memory array 20 and made available via data lines 26 external circuitry.

Flash memory 20 receives three control signals: chip-enable bar ("CEB") 22, write-enable bar "WEB" 26, and output-enable bar ("OEB") 24. CEB 22 input selects flash memory and is active low. OEB 24 is the output control for flash memory and should be used to gate data from the data pins from flash memory. OEB 24 is active low. Both control functions CEB 22 and OEB 24 must be logically active to obtain data at the data lines of flash memory. Write enable bar signal WEB 26 allows writes to memory array while CEB 22 is low. WEB 26 is active low.

Flash memory may be written to by bringing WEB 26 to a logic level high while CEB 22 is low. Addresses and data are latched on the rising edge of WEB 26. Standard microprocessor timings are used.

Device operations are selected by writing specific data patterns via the data input/output lines. Erase is initiated by a two-cycle command sequence. Completion of the erase event may be detected after a Read Status command. Programming is also executed by a two-command sequence. Polling the status register with the Read Status Register command determines when the programming sequence is complete.

FIG. 8 illustrates in block diagram form the circuitry of write state machine 32. Write state machine 32 includes an oscillator and generator 70, a next state controller 72, an event counter 74, a period counter 76, an address counter 78 and a data latch and comparator ("DLC") 80.

RESET 52 is applied to nearly all circuits within write state machine 32 and forces critical nodes within write state machine 32 to known states. For example, RESET 52 forces to a logic zero the terminal count signals 88, 90 and 92.

Shortly after receiving an inactive RESET signal 52, oscillator/phase generator 70 begins generating two non-overlapping phase clocks, phase 1 PH1 82 and phase 2 PH2 84, which are routed to nearly all WSM circuitry.

Next state controller 72 controls and coordinates the activities of write state machine 32 and determines the WSM's next state. Next state controller 72 generates the five outputs SBUS[0:4] 54 which indicate the current state of WSM 32.

Each circuit receiving SBUS [0:4] 54 from next state controller 72 performs its own SBUS [0:4] 54 decode to determine its next task. This design allows many tasks to be performed in parallel, minimizing the time needed it takes to perform erase and program functions.

Period counter 76 determines and times the pulse periods for array voltages during overerase repair, program, and erase operations. By going active-high, the period counter's 76 terminal count signal PCTRTC 88 informs the next state controller 72 that the selected period of time has elapsed. Period counter 76 decodes SBUS [0:4] 54 to select the desired pulse period.

Event counter 74 determines when the maximum number of overerase repair, program, or erase operations per byte has been reached. When the maximum number of operations per byte has been reached, event counters 74 informs next state controller 72 by bringing the event terminal count signal ECTRTC 90 to a logic high. Event counter 74 determines the maximum number of operations by decoding the SBUS [0:4] outputs 54. In the preferred embodiment, the maximum number of overerase repair operations per bit is 750; however, any maximum may be chosen.

Within WSM 32, address counter 78 functions as both an input buffer and a counter. When READY 50 is high the address at address lines A[0:16] is output as signals AY [0:6] 55 and AX [0.9]]57. Signals AY 55 and AX 57 point to the location of the byte in memory array 20 which is to be overerase repaired, programmed, or erased.

After the address has been input to the input buffers, the address from the input buffers will be loaded into the address counting circuitry under the control of CSM 40 via address latch enable signal ALE 49. The address counter 78 then counts through all the addresses in memory array 20.

Address counter 78 incorporates two counters, a column counter, also called a Y-counter, and a row counter, also called an X-counter. Each counter provides an active logic high terminal count signal to next state controller 72. The column counter outputs column terminal count signal AYTC and the row counter outputs row terminal count signal AXTC.

Data latch and comparator (DLC) 80 is the interface between the WSM 32 and the command state machine 40, and memory array 20 and data lines 26. TTL data input on data lines 26 is buffered by the DLC 80 and passed on to the command state machine 40 as DATAIN[0:7] signals 27.

If the signal received on DATAIN [0:7] lines 27 represents a program command, the command state machine 40 will direct DLC 80 to store the information at data lines 26 by setting the data latch enable signal DLE 47 to a logic one. During program erase and overerase verify operations, DLC 80 compares the data stored in its latches to sense amp signals SOUT [0:7] 59 and indicates a match by setting MATCH 94 to a logic high.

DLC 80 compares the sense amplifier output signals, SOUT [0:7] 59, which are indicative of memory cell contents, to a reference logic level during overerase verify procedures and indicates successful erasure to next state controller 72 by setting MATCH 94 to a logic high.

Status register 34 reports the status of write state machine 32 via status signals STAT [3:7] 56, which are multiplexed onto data input/output lines 26.

Content addressable memories (CAMs) (not shown) residing within array 90 output an active TWOROW signal to next state controller 72 whenever address counter 78 outputs an address that includes a shorted row. The significance of TWOROW will be discussed in detail later.

In FIG. 9, an alternative algorithm for repairing overerasure using write state machine 32 is illustrated. In FIG. 9, each box represents a state of write state machine 32. The name of each state is indicated on the top line of each box. The combination of signals that cause the next state controller 72 to branch to another state are generally indicated in the text beside each branch, with inactive signals preceded by an exclamation point "!." It will be understood that next state controller 72 branches from one state to another state regardless of the inputs to next state controller 72 when no combination of signals is indicated next to a branch. The algorithm of FIG. 9 also performs overerase repair on eight columns simultaneously. This is due to the arrangement of array 20 which applies the same address signal to eight different blocks simultaneously to access one byte.

For simplicity's sake, discussion of FIG. 9 begins with the overerase verification of a flash memory which includes no shorted rows and in which no cells are overerased. In other words, it will be assumed that the signal TWOROW is inactive and the signal MATCH is active.

Prior to beginning overerase verification, address counter 78 is reset to the beginning of its count ensuring that all columns within array will be overerase verified. Overerase verification begins in state 500 by resetting the bad column bit, BADCOLUMN. Simultaneously, the first cell on the first eight columns is erase verified. In other words, the output of each array cell is fed to a sense amplifier to be compared to a special reference cell.

In a preferred embodiment, the voltage levels utilized in the overerase verify circuit varies from those previously discussed. The basic circuitry of FIG. 5 is unchanged, however. This difference arises from the difficulty of trimming special reference cells to 0.5 volts. Instead, special reference cells are trimmed to 3 volts, a level that is easier to achieve. To source a current representative of a two volt difference between $V_T$ and $V_G$, 5 volts is applied to the gate of each special reference cell. In contrast, properly erased array cells have a $V_T$ of approximately 0.5 volts to 1.1 volts and the voltage applied to the gate of the array cells is 2.5 volts.

After performing overerase verification on the indicated byte, next state controller 72 branches from state 500 to state 502 if the column counter has not reached its terminal count. In state 502, write state machine 32 determines whether currently addressed cells passed overerase verification. Write state machine 32 also prepares for possible overerase repair by generating select signals for drain voltage switch 44. When enabled, drain voltage switch 44 pulls the drains of selected cells up to 7 volts, allowing their repair. The drains of unselected, i.e. properly erased cells, are grounded when drain voltage switch 44 is enabled, thus preventing the repair of unselected cells.

Data latch comparator 80 generates the select signals by comparing sense amplifier outputs SOUT[0:7] to expected values. For overerased cells the sense amplifier output does not match the expected value. Data latch comparator 80 responds to a mismatch by bringing a cell's associated select signal active high. For properly erased cells sense amplifier outputs and expected values agree and data latch comparator 80 responds by forcing inactive the cells' associated select signals.

If data latch comparator 80 indicates that all eight bits passed overerase verification by forcing MATCH active, then write state machine 32 branches to state 504 from state 502.

Write state machine 32 increments the row address in state 504. Write state machine 32 then branches from state 504 to 506.

In state 506, the next cell on each of the eight addressed columns is overerase verified. Overerase verification of the currently addressed columns continues if AXTC is inactive. Write state machine 32 responds to the inactive AXTC by branching from state 506 to state 502.

In state 502, write state machine 32 determines whether any of the currently addressed cells should be overerased repaired.

Given the assumption that none of the cells in array 20 are overerased, write state machine branches through states 502, 504 and 506 until the row counter reaches its terminal count. Upon receiving an active AXTC signal from the row counter, write state machine 32 branches from state 506 to state 508. In state 508, the column counter increments its count, thus selecting another eight columns for overerase verification and repair.

From state 508, write state machine 32 branches to state 500. Write state machine 32 then branches through states 500, 502, 504, 506 and 508 until the column counter reaches its terminal count. Once next state controller 72 receives an active terminal count signal AYTC, write state machine 32 branches out of the algorithm to state 530.

Consider the operation of write state machine 32 when a cell fails overerase verification. Assume for simplicity that array 20 includes no shorted rows and event counter has not yet timed out. In other words, write state machine 32 is in state 502 and the signals MATCH, ECTRTC and TWOROW are inactive.

In that state, the currently addressed cells are prepared for the application repair voltage of to the gate of each cell that failed overerase verification. When the period counter times out, write state machine 32 branches to state 512, where the period counter is reset.

From state 512, write state machine 32 branches to state 514 where drain voltage switch 44 is enabled. This applies 7 volts to the drains of cells that failed overerase verification, which were selected in state 502. The drains of all other cells are grounded. Again, the voltage is held until the period counter reaches its terminal count. Thereafter, write state machine 32 branches to state 516 to overerase verify the repaired cells.

From state 516, write state machine 32 branches to state 518. There, the success of the repair operation is analyzed by evaluating MATCH. If MATCH is a logic high, repair was successful and write state machine branches to state 504.

If, on the other hand, the cell condition fails to overerase verify, the write state machine proceeds to state 520 from state 518. There BAD COLUMN is set, guaranteeing that at least one more verification pass of the currently addressed columns will be made. Note that BAD COLUMN is set only if a cell fails to pass overerase verification after the application of a first repair pulse. Thus, a single conditioning pulse may be applied without causing every cell on the same column to be verified once again. During manufacture, this can save as much as 32 milliseconds.

From state 520, the write state machine 32 branches back to state 504 where address counter 78 increments the row address. Thereafter, write state machine 32 branches to state 506 where the next byte is overerase verified. Assuming that none of the other cells on the currently addressed columns fail overerase verification, write state machine 32 branches through states 502, 504 and 506 until the end of the columns is reached, as indicated by an active level on AXTC. Write state machine 32 then branches to state 524 from state 506 because BAD COLUMN is active.

In state 524, the repair voltage level is incremented in preparation for another overerase repair pass of the currently addressed columns. Preferably, the programming voltage level is increased by incrementing a digital signal which is input to an digital-to-analog converter. Preferably, the digital-to-analog converter provides a minimum output voltage of 5 volts and a maximum output voltage of 7 volts in 0.5 volt steps. Other voltage ranges may be used, however, as dictated by the particular memory array being repaired.

From state 524, write state machine 32 branches to state 500. Because the column counter was not incremented, overerase verification begins again with the first cell on the currently addressed columns.

Overerase verification on the currently addressed cells is then performed. Assuming that not every column within array 20 has been examined, write state machine 32 branches to state 502 from state 500. Write state machine 32 then branches through states 502, 510, 512, 514, 516, 518, 520, 504, 506, 524 and 508 as previously described until every overerased cell within memory array 20 has been repaired or until some cell cannot be repaired before the event counter reaches its terminal count. Event counter allows up to 750 overerase repair attempts to be made for each column. After 750 overerase repair attempts event counter forces ECTRTC active high. In response, write state machine 32 branches from state 502 to state 532 and overerase repair fails.

The algorithm of FIG. 9 accommodates a flash memory that provides row redundancy. Row redundancy means that two rows which are shorted together are replaced by other rows elsewhere within array 20. Even though rows replaced by redundant elements do not contain meaningful information, they still affect the repair of other cells within array 20. Overerased cells within shorted rows contribute to column leakage currents and they must therefore, be repaired to prevent over repairing good cells on the same column. During a normal post condition repair operation, 5 volts is applied to the gates of array cells being repaired while all other gates within the array are held at ground. Following this procedure with shorted rows grounds the 5 volt supply and ruins the flash memory. Thus, repair of shorted rows requires that both rows have their gates connected to the same voltage level. (This is true of all operations involving shorted rows.) The current output of the shorted cells will exceed that of a properly erased cell because both of the shorted cells contribute to the current flow into the sense amplifier. Misidentifying a cell shorted to another row as overerased is hazardous because it may result in the over repair of properly erased cells on the same column. The current algorithm attempts to avoid overrepair of columns including shorted row by over repairing cells within shorted rows. Over-repair of cells within shorted rows is attempted by applying 10 volts to the gate during overerase repairs.

The algorithm of FIG. 9 only accommodates row redundancies for pairs of shorted rows. The first shorted row encountered by write state machine 32 is referred to as the lower row and the second row encountered is referred to as the upper row. Because address counter 78 counts in a linear fashion the lower row is addressed first. Given that the gates of both the lower and upper rows are driven to 10 volts during repair of the lower row, both rows are repaired simultaneously. Thus, when address counter 78 increments to the address of the upper row, there is no need to repair the upper row. The algorithm of FIG. 9 therefore prevents repair of the upper row subsequent to repair of the lower row.

To illustrate the manner in which FIG. 9 accommodates row redundancy, assume address counter 78 indicates the first row of a shorted pair, and that overerase verification has failed. In other words, MATCH is inactive and TWOROW is active. Assuming that the event counter has not reached its terminal count, write state machine 32 branches to state 522 from state 502. In state 522, 10 volts is applied to the gates of both the upper and lower row of shorted cells.

After PCTRTC goes active, write state machine 32 branches from state 522 through states 512, 514, 516, 518 and 520, as discussed previously. In state 504, the operation of write state machine 32 varies slightly to accommodate the active TWOROW signal. When the row address is incremented by one, address counter 78 indicates the upper row by maintaining TWOROW at an active level. Given that TWOROW is active, the row address counter increments its count until TWOROW goes inactive. Write state machine branches to state 506 in response.

One may wonder how a shorted row is ever repaired given that write state machine 32 does not branch from state 504 until the signal TWOROW is inactive. The pipelined design of write state machine 32 guarantees that TWOROW will not become active immediately upon addressing the lower row of a shorted pair. This allows write state machine 32 to branch from state 504 to state 506 upon addressing the lower row. However, TWOROW is active by the time write state machine 32 enters state 502. From state 502, write state machine 32 executes the algorithm in the manner discussed previously.

Thus, a method of identifying and repairing overerased flash memory cells using low voltage level channel hot electron programming has been described. A method of repairing overerased flash memory cells using a write state machine has also been described.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of repairing overerased cells in a flash memory array having a column, the column having a first cell and a second cell, the method comprising the steps of:

a) determining if either the first cell or the second cell of the column is overerased;

b) if either the first cell or the second cell of the column is overerased:

i) applying a repair pulse to the first cell, the repair pulse having a repair voltage level, the repair voltage level having an initial repair voltage level low enough to have little effect on a threshold voltage of a properly erased cell and high enough to greatly effect a threshold voltage of a severely overerased cell;

ii) applying the repair pulse to the second cell;

iii) incrementing the repair voltage level by a first amount; and iv) repeating steps i) through iii) until the column is repaired.

2. The method of claim 1 wherein the repair voltage level is low enough to prevent over-repair of the first and second cells.

3. The method of claim 1 wherein it is determined that the column includes an overerased cell by comparing a threshold voltage associated with the first and second cells to a reference voltage representative of a properly erased cell.

4. The method of claim 1 wherein it is determined that the column includes an overerased cell by measuring a leakage current of the column.

5. The method of claim 1 wherein the initial repair voltage level is within a range of 3 volts to 5 volts.

6. The method of claim 1 wherein the first amount is approximately 0.5 volts.

7. The method of claim 1 wherein the repair voltage level is incremented to a maximum repair voltage level that is within a range of 7 volts to 12 volts.

8. A method of repairing overerased cells in a flash memory array having a column, the column having a first cell and a second cell, the method comprising the steps of:

a) applying a repair pulse to the first cell if the first cell is overerased, the repair pulse having a repair voltage level;

b) applying the repair pulse to the second cell if the second cell is overerased;

c) incrementing the repair level by a first amount if either of the first and second cells was identified as overerased; and d) repeating steps a) through c) until each of the first cell and the second cell have a threshold voltage level within an acceptable erase voltage range.

9. The method of claim 8 wherein the repair voltage level is low enough to prevent over-repair of the first and second cells.

10. The method of claim 8 wherein the cells are identified as over-erased by comparing a cell threshold voltage to a reference voltage representative of a properly erased cell.

11. The method of claim 8 wherein an initial repair voltage level is within a range of 3 volts to 5 volts.

12. The method of claim 8 wherein the first amount is approximately 0.5 volts.

13. The method of claim 8 wherein the repair voltage level is incremented to a maximum repair voltage level within a range of 7 to 12 volts.

14. A method of repairing overerased cells in a flash memory array having a column, the column having a first cell and a second cell, the method comprising the steps of:

a) identifying whether the first cell is overerased;

b) applying a repair pulse having a repair voltage level;

c) identifying whether the second cell is overerased;

d) applying a repair pulse to the second cell if the second cell is overerased, e) incrementing the repair voltage level by a first amount if either of the first and second cells was identified as overerased; and f) repeating steps a) through e) until neither the first cell nor the second cell is identified as overerased.

15. The method of claim 14 wherein the repair voltage level is low enough to prevent over-repair of the first and second cells.

16. The method of claim 14 wherein the first and second cells are identified as over-erased by comparing a cell threshold voltage to a reference voltage representative of a properly erased cell.

17. The method of claim 14 wherein an initial repair voltage level is within a range of 3 volts to 5 volts.

18. The method of claim 14 wherein the first amount is approximately 0.5 volts.

19. The method of claim 14 wherein the repair voltage level is incremented to a maximum voltage level equal to 5 volts to 12 volts.

20. A method of repairing overerased cells in a flash memory array having a column, the column having a first cell and a second cell, the method comprising the steps of:

a) identifying whether the first cell is overerased, an overerased cell having a threshold voltage below a minimum acceptable erase voltage;

b) applying a repair pulse to the first cell if the first cell is overerased, the repair pulse having an initial repair voltage level low enough to prevent over-repair of the first cell by raising a first threshold voltage of the first cell above a maximum acceptable erase voltage;

c) identifying whether the second cell is overerased;

d) applying the repair pulse to the second cell if the second cell is overerased, e) incrementing the repair voltage level by a first amount if either of the first and second cells was identified as overerased; and f) repeating steps a) through e) until neither the first cell nor the second cell is identified as overerased.

21. The method of claim 20 wherein the cells are identified as over-erased by comparing a cell threshold voltage to a reference voltage.

22. The method of claim 20 wherein the initial repair voltage level is within a range of 3 volts to 5 volts.

23. The method of claim 20 wherein the first amount is approximately 0.5 volts.

24. The method of claim 20 wherein the repair voltage level is incremented to a maximum repair voltage level equal of 7 volts.

25. A method of repairing overerased cells in a flash memory array having a column, the column having a first cell and a second cell, each of the first and second cells having a threshold voltage, the method comprising the steps of:

a) identifying whether the first cell is overerased by comparing the threshold voltage of the first cell to a reference voltage representative of a properly erased cell;

b) applying a repair pulse to the first cell if the first cell is overerased, the repair pulse having an initial repair voltage level low enough to prevent over-repairing the first cell, over-repair raising a threshold voltage of a cell above a maximum acceptable erase voltage;

c) identifying whether the second cell is overerased by comparing the threshold voltage of the second cell to the reference voltage;

d) applying the repair pulse to the second cell if the second cell is overerased, e) incrementing the repair voltage level by a first amount if either of the first cell and second cell was identified as overerased; and f) repeating steps a) through e) until both the first cell and the second cell have threshold voltages within an acceptable erase voltage range.

26. The method of claim 25 wherein the first amount is approximately 0.5 volts.

27. The method of claim 25 wherein the repair voltage level is incremented to a maximum repair voltage level equal to 7 volts.

28. A method of repairing overerased cells in a non-volatile semiconductor array having a column, the column having a first cell and a second cell, each of the cells having a threshold voltage, the method comprising the steps of:

a) initializing a counter;

b) identifying whether the first cell is overerased by comparing the threshold voltage of the first cell to a reference voltage representative of a properly erased cell;

c) applying a repair pulse to the first cell if the first cell is overerased, the repair pulse having an initial repair voltage level low enough to prevent over-repairing the first cell, overrepair raising a threshold voltage of a cell above a maximum acceptable erase voltage;

d) identifying whether the second cell is overerased by comparing the threshold voltage of the second cell to the reference voltage;

e) applying repair pulse to the second cell if the second cell is overerased;

f) incrementing the repair voltage level by a first amount if either of the first and second cells was identified as overerased;

g) incrementing the counter; and h) repeating steps a) through g) until neither the first cell nor the second cell is identified as overerased or the counter is equal to maximum count.

29. The method of claim 28 wherein the first amount is approximately 0.5 volts.

30. The method of claim 28 wherein the repair voltage level is incremented to a maximum repair voltage level equal to 7 volts.

31. The method of claim 28 wherein the initial repair voltage level is within a range of 4 volts to 5 volts.

32. A method of repairing overerased cells in a flash memory array having a column, the column having a first cell and a second cell, the method comprising the steps of:

a) clearing a flag;

b) applying a repair pulse to the first cell if the first cell is overerased, the repair pulse having an initial repair voltage level low enough to prevent over-repairing an overerased cell;

c) setting the flag if the first cell remains overerased;

d) applying the repair pulse to the second cell if the second cell is overerased;

e) setting the flag if the second remains overerased;

f) incrementing the repair voltage level by a first amount if the flag is set; and g) repeating steps a) through f) if the flag is set.

33. The method of claim 32 wherein the first amount is approximately 0.5 volts.

34. The method of claim 32 wherein the repair voltage level is incremented to a maximum repair voltage level equal to 7 volts.

35. A method of repairing overerased cells in a flash memory array having a column, the column having a first row and a second row, the method comprising the steps of:

a) clearing a flag;

b) if the first cell is overerased and not shorted to the second cell, applying a repair pulse having an initial repair voltage level low enough to prevent over-repair;

c) if the first cell is overerased and shorted to the second cell, applying the repair pulse to both the first cell and the second cell, d) setting the flag if the first cell remains overerased;

e) if the second cell is overerased and not shorted to the first cell applying a repair pulse having the initial repair voltage level to the second cell;

f) setting the flag if the second cell remains overerased;

g) incrementing the repair voltage level by a first amount if the flag is set; and h) repeating steps a) through g) if the flag is set.

36. The method of claim 35 wherein the repair pulse has a voltage level high enough to over-repair overerased cells when the first cell is shorted to the second cell.

37. A method of repairing overerased cells in a flash memory array having column, the column having a first cell and a second cell, the method comprising the steps of:

a) applying a repair pulse to the first cell if the column includes an overerased cell, the repair pulse having a repair time duration;

b) applying a repair pulse to the second cell if the column includes an overerased cell;

c) incrementing the repair time duration by a first amount if the column includes an overerased cell; and d) repeating steps a) through c) until the column is repaired.

38. The method of claim 37 wherein the repair time duration short enough to prevent over-repair of the first and second cells.

* * * * *